United States Patent
Asai et al.

(10) Patent No.: US 8,894,250 B2
(45) Date of Patent: Nov. 25, 2014

(54) ILLUMINATING DEVICE

(75) Inventors: Masaki Asai, Kitasaku-gun (JP); Koji Sakai, Kitasaku-gun (JP); Ryohei Takayama, Kitasaku-gun (JP)

(73) Assignee: Minebea Co., Ltd., Nagano (JP)

( * ) Notice: Subject to any disclaimer, the term of this patent is extended or adjusted under 35 U.S.C. 154(b) by 143 days.

(21) Appl. No.: 13/405,825

(22) Filed: Feb. 27, 2012

(65) Prior Publication Data

US 2012/0300466 A1    Nov. 29, 2012

(30) Foreign Application Priority Data

May 27, 2011    (JP) .................. 2011-119312

(51) Int. Cl.
*F21V 5/02*    (2006.01)
*F21V 7/00*    (2006.01)
*G02B 5/04*    (2006.01)
*G02B 19/00*    (2006.01)
*H01L 33/58*    (2010.01)
*F21Y 101/02*    (2006.01)
*F21V 13/04*    (2006.01)

(52) U.S. Cl.
CPC ............. *F21V 5/02* (2013.01); *F21V 7/0091* (2013.01); *G02B 5/045* (2013.01); *F21Y 2101/02* (2013.01); *G02B 19/0061* (2013.01); *F21V 13/04* (2013.01); *H01L 33/58* (2013.01); *G02B 19/0009* (2013.01)
USPC ........... 362/309; 362/308; 362/326; 362/327; 362/328; 362/329; 362/330; 362/331; 362/332; 362/334; 362/335; 362/336; 362/337; 362/338; 362/339; 362/340

(58) Field of Classification Search
USPC .................. 362/308–309, 326–340
See application file for complete search history.

(56) References Cited

U.S. PATENT DOCUMENTS

2011/0286221 A1*    11/2011    Saito ................. 362/311.06

FOREIGN PATENT DOCUMENTS

JP    A-2007-220465    8/2007

* cited by examiner

*Primary Examiner* — William Carter
(74) *Attorney, Agent, or Firm* — Oliff PLC (57) ABSTRACT

In an illuminating device, when exiting lights come out from a lens sheet, the optical paths of the exiting lights are deflected in a direction opposite to an optical axis of a light source by means of a plurality of prisms which are included in a first lens group arranged on an inward side of the lens sheet located adjacent to the optical axis of the light source and each of which has a inclined face facing toward the optical axis of the light source, wherein the exiting lights from the light source via the first lens group of the lens sheet are adapted to mix with exiting lights from the light source via a second lens group located outside the first lens group, whereby the degree of color unevenness is reduced, that appears inherently when a pseudo white LED is used as the light source of the illuminating device.

7 Claims, 7 Drawing Sheets

ILLUMINATING DEVICE

BACKGROUND OF THE INVENTION

1. Field of the Invention

The present invention relates to an illuminating device.

2. Description of the Related Art

Conventionally, an incandescent lamp or a fluorescent lamp has been typically used as a light source for general illumination, such as indoor lighting. Recently, the performance of a blue LED (light emitting diode) has been enhanced and so an LED is increasingly used also as a light source for a ceiling light, a down light, or the like (refer to, for example, Japanese Patent Application Laid-Open No. 2007-220465).

Figure 7:
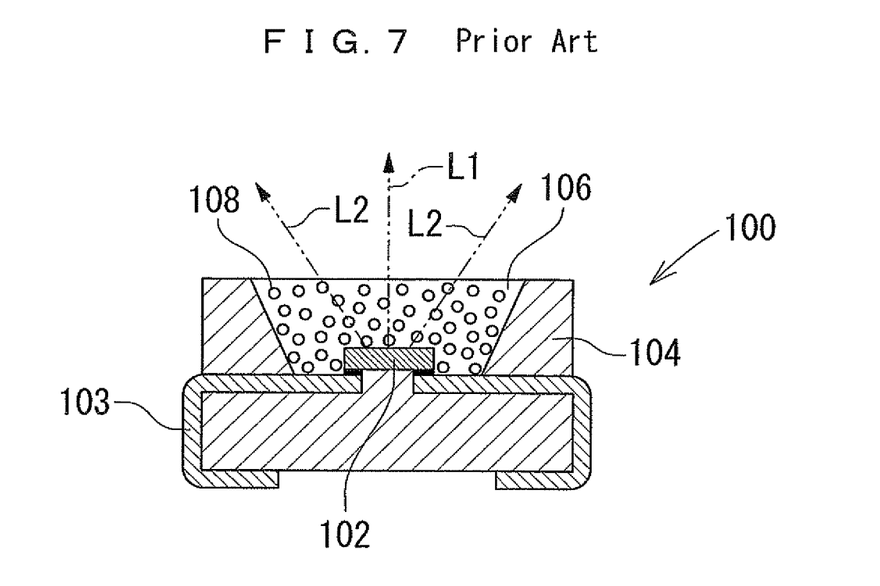
FIG. 7 is a schematic cross-sectional view of a pseudo white LED and exiting lights coming out therefrom.

FIG. 7 shows what is called a pseudo white LED 100 that can be used as a light source for a lighting device. The pseudo white LED 100 includes: a blue LED 102 as a light emitting element; a lamp house 104 at a bottom of which the blue LED is disposed; and transparent resin 104 which seals a recess portion of the lamp house 104 and in which a yellow color fluorescent material 108, such as garnet (YAG), is dispersed.

A blue light emitted from the blue LED 102, while traveling through the transparent resin 106 disposed in the lamp house 104, is diffused, also at the same time is subjected to wavelength conversion by the yellow color fluorescent material 108 into a yellow color fluorescence, and then is emitted out of the lamp house 104 as exiting lights L (L1 and L2: illustrated by dashed double-dotted lines for the sake of convenience). In FIG. 7, reference number 103 refers to electrode terminals.

Figure 8:
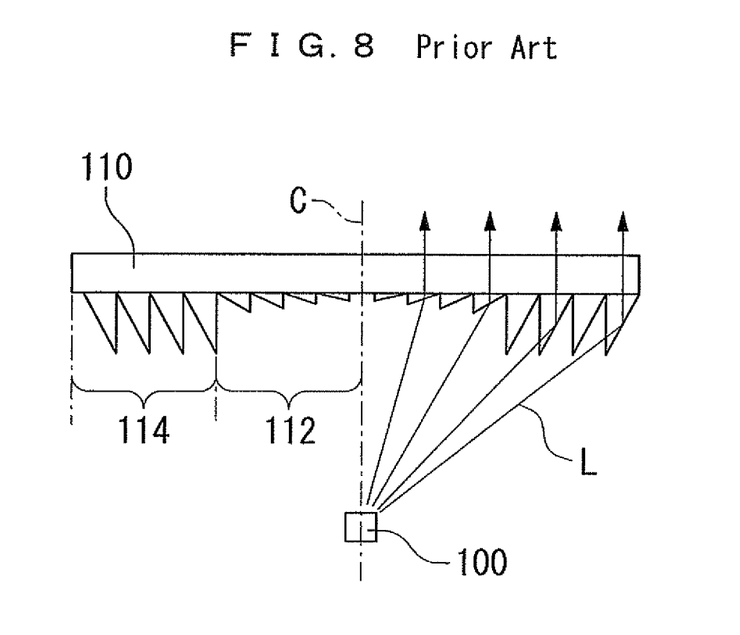
FIG. 8 is a schematic cross-sectional view of a conventional illuminating device using a pseudo white LED as a light source.

Also, the exiting lights L emitted from the pseudo white LED 100, when going through a lens sheet 110 arranged in front of the pseudo white LED 100, are deflected in the intended direction as illustrated in FIG. 8, whereby the pseudo white LED 100 is adapted to function as a light source for an illumination device.

Referring to FIG. 8, the lens sheet 110 includes: a first lens group 112 which is composed of refracting prisms and which is arranged inwardly to be located adjacent to an optical axis C of the pseudo white LED 100; and a second lens group 114 which is composed of reflecting prisms (TIR: total internal reflection) and which is arranged outwardly to be located away from the optical axis C of the pseudo white LED 100 so as to surround the first lens group 112.

The exit angles of the exiting lights L emitted from the pseudo white LED 100 are deflected by both the first lens group 112 and the second lens group 114 so as to travel in the direction parallel to the optical axis C.

In the illuminating device using the pseudo white LED 100 described above, however, the exiting lights emitted from the pseudo white LED 100 and located inwardly close to the optical axis C of the pseudo white LED 100 tend to be slightly tinged with a blue hue, while the exiting lights located at the fringe region away from the optical axis C of the pseudo white LED 100 tend to be slightly tinged with a yellow hue.

The above phenomenon is caused due to the fact that the exiting lights L2 which are directed obliquely with respect to the optical axis C of the pseudo white LED 100 travel through a longer light path in the transparent resin 106 having the yellow color fluorescent material 108 dispersed therein, compared to the exiting lights L1 which are directed parallel to the optical axis C of the pseudo white LED 100, which results in that the exiting lights L2 are more subjected to wavelength conversion by the yellow color fluorescent material 108 into yellow light fluorescence than the exiting lights L1.

The conventional illumination device using an incandescent lamp or a fluorescent lamp does not suffer such a color unevenness problem of illuminating light, which is inherent in the illumination device using the above described pseudo white LED 100 as a light source.

The present invention has been made in light of the problem described above, and it is an object of the present invention to provide an illumination device using a pseudo white LED in which a degree of color unevenness is reduced without impairing the brightness of illumination light.

The embodiment shown in the following description of the invention is presented to exemplify a configuration according to the present invention and provide an explanation on an aspect-by-aspect basis for the purpose of facilitating understanding of a diversity of the configuration of the present invention. Each aspect does not limit the technical scope of the present invention, and modifications developed by replacing, eliminating a part of the constituent elements of each aspect, or further by adding some other constituent elements thereto are included in the technical scope of the present invention.

In order to achieve the object described above, according to a first aspect of the present invention, there is provided an illuminating device including: a light source which includes a light emitting element and a fluorescent material; and a lens sheet which includes a plurality of prisms arranged symmetrically with respect to the optical axis of the light source, and which at least includes a first lens group located adjacent to the optical axis of the light source and a second lens group located outside the first lens group, wherein the first lens group includes a plurality of prisms each having an inclined face facing toward the optical axis of the light source.

In the illuminating device according to the first aspect, when exiting lights emitted from the light source come out from the lens sheet, the optical paths of the exiting lights are deflected in a direction opposite to the optical axis of the light source by means of the plurality of prisms which are included in the first lens group located at a portion of the lens sheet adjacent to the optical axis of the light source, which are arranged symmetrically with respect to the optical axis of the light source, and each of which has the inclined face facing toward the optical axis of the light source.

Here, if, when controlling the direction of the deflection, the heights of the prisms are increased so as to change the inclination angle of the inclined face in accordance with the distance from the optical axis of the light source, the area of a face (parallel face) of the prism oriented parallel to the optical axis of the light source is increased.

However, since the inclined faces of the prisms of the first lens group face toward the optical axis of the light source, the exiting lights emitted from the light source do not enter directly the parallel face of the prism, and thus the utilization efficiency of light is not lowered. And, the exiting lights emitted from the light source and coming out via the first lens group of the lens sheet are adapted to mix with the exiting lights emitted from the light source and coming out via the second lens group located outside the first lens group.

According to a second aspect of the present invention, in the illuminating device as described above in the first aspect, the plurality of prisms included in the first lens group may be configured such that respective inclination angles of the inclined faces decrease with an increase in distance from the optical axis of the light source.

In the illuminating device according to the second aspect, the plurality of prisms included in the first lens group are configured such that respective inclination angles of the inclined faces decrease with an increase in distance from the optical axis of the light source, whereby the direction of deflection can be controlled in accordance with the distance from the optical axis of the light source by means of the plurality of the prisms included in the first lens group.

Specifically, for example, the inclination angles of the inclined faces are configured to decrease with an increase in distance from the optical axis of the light source so that the exit angles of the exiting lights emitted from the light source and coming out via the first lens group of the lens sheet are uniform independent of the distance from the optical axis of the light source.

According to a third aspect of the present invention, in the illuminating device as described above in the first and second aspects, the second lens group may include a plurality of reflecting prisms.

In the illuminating device according to the third aspect, since the second lens group includes the plurality of reflecting prisms, the exiting lights which are emitted from the light source and come out via the second lens group are deflected, in a region of the lens sheet located outside the first lens group, so as to travel in the direction parallel to or approaching the optical axis of the light source.

Accordingly, the exiting lights emitted from the light source and coming out via the first lens group can be well mixed with the exiting lights emitted from the light source and coming out via the second lens group located outside the first lens group.

According to a fourth aspect of the present invention, in the illuminating device as described above in the third aspect, a third lens group, which includes a plurality of prisms each having an inclined face facing in the direction opposite to the optical axis of the light source, may be provided and located between the first lens group and the second lens group.

In the illuminating device according to the fourth aspect, the exiting lights emitted from the light source are deflected also by the third lens group. Since the inclined faces of the prisms included in the third lens group face in the direction opposite to the optical axis of the light source, the exiting lights emitted from the light source and entering the third lens group are refracted at the inclined faces of the prisms and thereby deflected so as to travel in the direction toward (which is the opposite direction compared to the deflection of the exiting lights coming out via the first lens group) or parallel to the optical axis of the light source.

And, the exiting lights emitted from the light source and coming out via the first lens group, the exiting lights emitted from the light source and coming out via the second lens group and the exiting lights emitted from the light source and coming out via the third lens group arranged between the first and second lens groups are adapted to mix with one another thereby achieving further color mix.

According to a fifth aspect of the present invention, in the illuminating device as described above in the first and second aspects, the second lens group may include a plurality of prisms each having an inclined face facing in the direction opposite to the optical axis of the light source.

In the illuminating device according to the fifth aspect, since the inclined faces of the plurality of prisms included in the second lens group are configured to face in the direction opposite to the optical axis of the light source, the exiting lights emitted from the light source and entering the second lens group are refracted at the inclined faces of the prisms in a region of the lens sheet located outside the first lens group, and are thereby deflected so as to travel in the direction toward (which is the opposite direction compared to the deflection of the exiting lights coming out via the first lens group) or parallel to the optical axis of the light source.

Accordingly, the exiting lights emitted from the light source and coming out via the first lens group can be well mixed with the exiting lights which are emitted from the light source and come out via the second lens group located outside the first lens group.

According to a sixth aspect of the present invention, in the illuminating device as described above in any one of the first to fifth aspects, the plurality of the prisms included in each of the first, second and third lens groups may be arranged rotationally symmetrically with respect to the optical axis of the light source.

In the illuminating device according to the sixth aspect, since the plurality of the prisms included in the respective lens groups are arranged rotationally symmetrically with respect to the optical axis of the light source, the exiting lights emitted from the light source and coming out via lens sheet can be well mixed with respect to all the radial directions around the optical axis of the light source 12.

According to a seventh aspect of the present invention, in the illuminating device as described above in any one of the first to sixth aspects, the light emitting element may be a blue light emitting diode (LED), wherein the fluorescent material causes a blue light emitted from the blue LED to be subjected to wavelength conversion into a yellow color fluorescence.

In the illuminating device according to the seven aspect, the blue light emitted from the blue LED is subjected to wavelength conversion by the fluorescent material into a yellow color fluorescence, thus a pseudo white LED.

And, the exiting lights emitted from the pseudo white LED are well mixed with one another by means of the prisms of the lens sheet as described above, and thereby the color unevenness inherent to the pseudo white 100 can be reduced or even overcome.

DETAILED DESCRIPTION OF THE INVENTION

An exemplary embodiment of the present invention will hereinafter be described in conjunction with the accompanying drawings, wherein constituent parts identical or corresponding to those of conventional art are denoted by the same reference number and a detailed description thereof will be omitted.

Figure 1A:
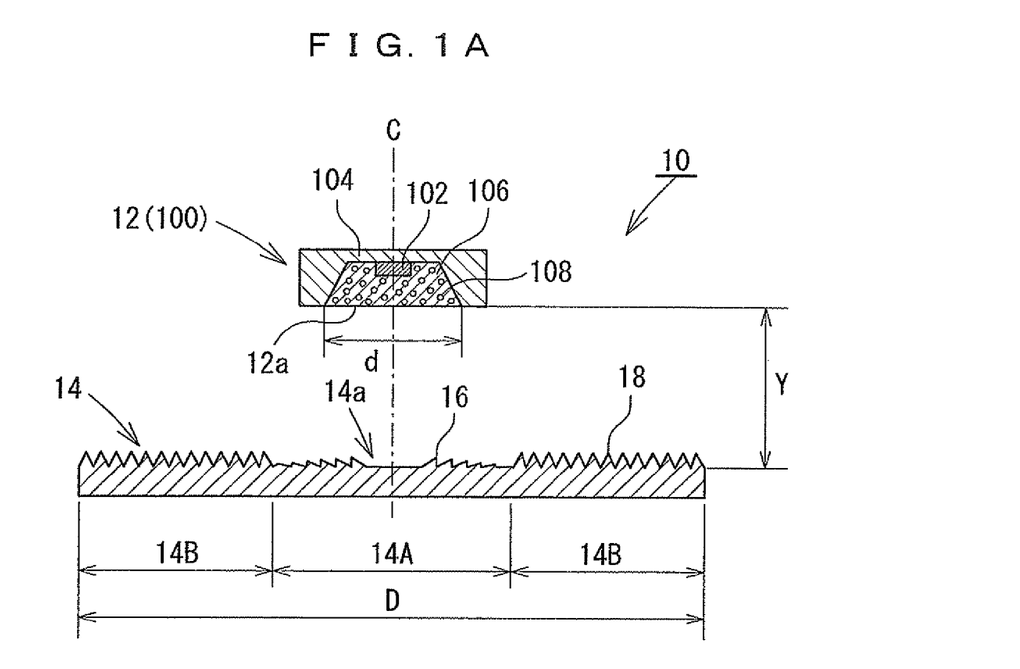
FIG. 1A is a schematic cross-sectional view of an entire structure of an illuminating device according to an embodiment of the present invention.

Referring to FIG. 1A, an illuminating device 10 according to an embodiment of the present invention includes a light source 12 and a lens sheet 14 including a plurality of prisms arranged symmetrically with respect to an optical axis C of the light source 12.

The light source 12 is a pseudo white LED structured same as a conventional pseudo white LED 100 shown in FIG. 7 and therefore constituent parts of the light source 12 are denoted by the same reference numbers as in FIG. 7.

The lens sheet 14 is disposed in front of a light emitting face 12a of the light source 12 (that is, the lens sheet 14 is located in the direction of light emission). The lens sheet 14 has a disk-like shape in which the optical axis C of the light source 12 is centrally positioned.

On a side surface 14a of the lens sheet 14 facing the light source 12, a first lens group 14A is formed so as to be located inwardly adjacent to the optical axis C of the light source 12 and a second lens group 14B is formed so as to be located outwardly thus surrounding the first lens group 14A. Each of the first and second lens groups 14A and 14B includes plurality of prisms (to be described later) disposed rotationally symmetrically with respect to the optical axis C of the light source 12.

The illuminating device 10 further includes a reflecting mirror (not illustrated in the figure) which is shaped into a bowl or a circular cylinder with a bottom and which is adapted to entirely cover the light source 12 and the outer rim portion of the lens sheet 14.

Figure 1B:
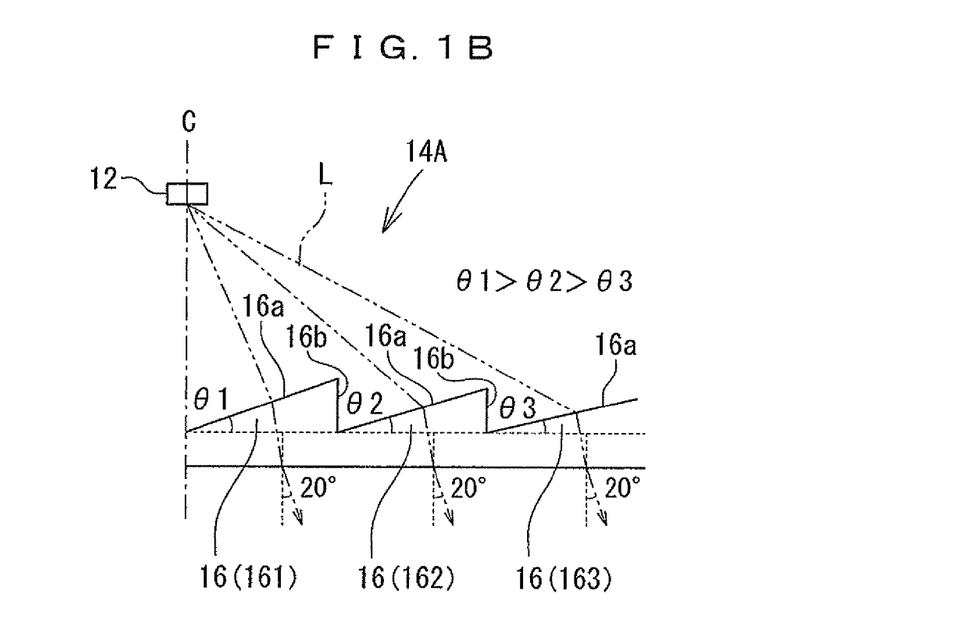
FIG. 1B is an enlarged explanatory view of one half portion of a first lens group which is arranged on a lens sheet shown in FIG. 1A so as to be located inwardly in a region adjacent respect to an optical axis of a light source.

Referring to FIG. 1B, the first lens group 14A includes a plurality of prisms 16 each of which has an inclined face 16a facing toward the optical axis C of the light source 12. In the present description below, the first lens group 14A, which is composed of the plurality of prisms 16 each having the inclined face 16a facing toward the optical axis C of the light source 12 as described above, is referred to as "concave Fresnel lens" as appropriate.

As shown in FIG. 1B, the plurality of prisms 16 (161, 162, 163 and so on) of the first lens group 14A are formed such that respective inclination angles θ1, θ2, θ3 and so on of the inclined faces 16a decrease with an increase in the distance from the optical axis C of the light source 12 (thus, θ1>θ2>θ3).

In this connection, in the plurality of prisms 161, 162, 163 and so on of the first lens group 14A in the particular embodiment shown in FIGS. 1A and 1B, the inclination angles θ1, θ2, θ3 and so on of the inclined faces 16a are determined in consideration of a distance Y defined between the light emitting face 12a of the light source 12 and the side surface 14a (facing the light source 12) of the lens sheet 14 (or in consideration of an angle defined between the optical axis C and a virtual line connecting between the light emitting face 12a and the side surface 14a), so that all of the lights, which are emitted from the light source 12 and then come out via the first lens group 14A, exit from the lens sheet 14 at a uniform angle of 20 degrees independent of the distance from the optical axis C of the light source 12.

The inclination angles θ1, θ2, θ3 and so on of the inclined faces 16a of the prisms 161, 162, 163 and so on can be easily obtained by a publicly known relational expression.

On the other hand, the second lens group 14B of the lens sheet 14 includes a plurality of reflecting prisms 18. While the distance Y between the light emitting face 12a of the light source 12 and the side surface 14a (facing the light source 12) of the lens sheet 14 is determined so as to be substantially equal to a diameter d of the light emitting face 12 of the light source 12 in the embodiment of the present invention, it is preferable to set to satisfy: $0.5d \leq Y \leq 1.5d$ in order to reduce color unevenness without impairing the brightness of illumination light and also to reduce the size of the illuminating device 10. For the same reason, a diameter D of the lens sheet 14 is preferably set to satisfy: $TAN^{-1}(D/2Y)<80$ degrees.

Figure 2A:
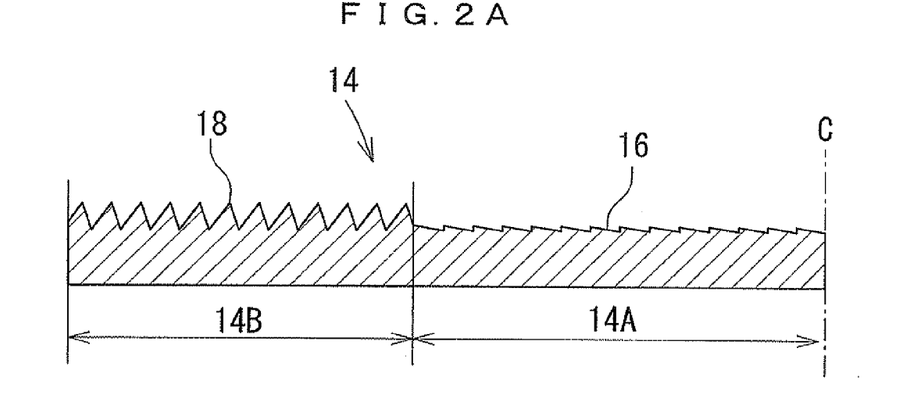
FIG. 2A is a schematic cross-sectional view of one half portion of an example of lens sheet of the illuminating device shown in FIG. 1A.
Figure 2B:
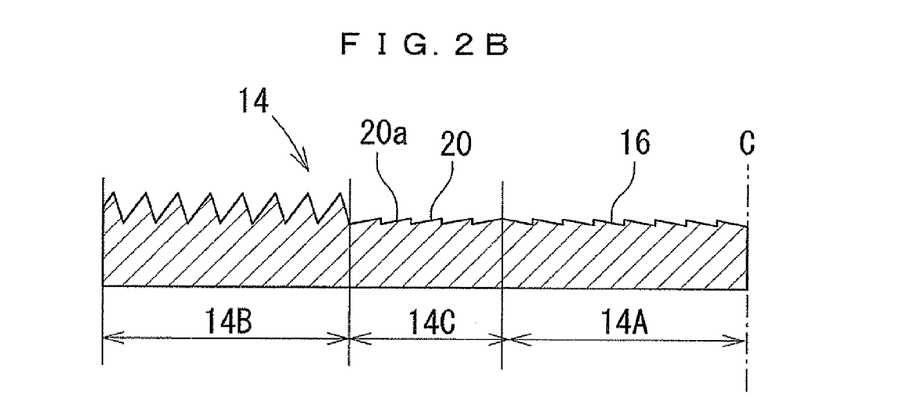
FIG. 2B is a schematic cross-sectional view of one half portion of a modified example of lens sheet.
Figure 2C:
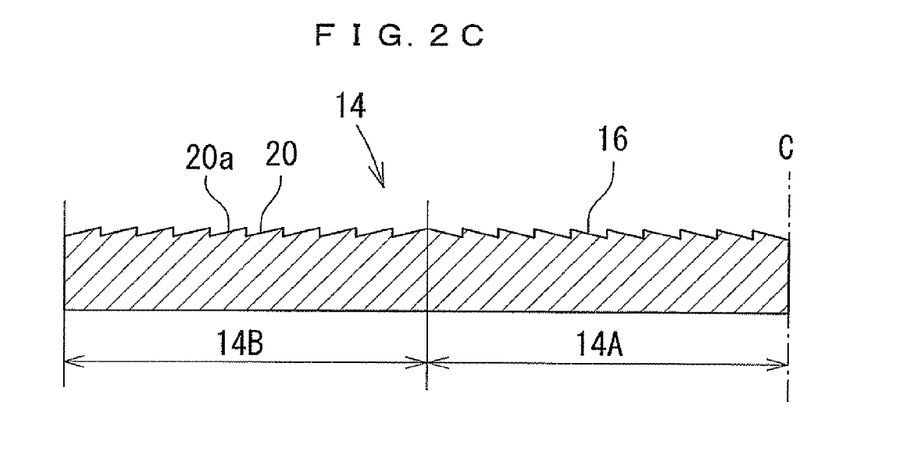
FIG. 2C is a schematic cross-sectional view of one half portion of another modified example of lens sheet.

FIGS. 2A to 2C schematically show examples of lens sheets 14 suitable for the illuminating device 10 according to the embodiment of the present invention. The example shown in FIG. 2A is the same as shown in FIG. 1A and therefore an explanation thereof will be omitted.

The example shown in FIG. 2B further includes a third lens group 14C which is located between the first and second lens groups 14A and 14B shown in FIG. 2A and which has a plurality prisms 20 each having an inclined face 20a facing in a direction opposite to the optical axis C of the light source 12.

In the present description, a lens group, such as the lens group 14C which is composed of the plurality of prisms 20 each having the inclined face 20a facing in the direction opposite to the optical axis C of the light source 12, is referred to as "convex Fresnel lens" as appropriate.

In the particular example shown in FIG. 2B, the third lens group 14C is disposed in a space which is created between the first and second lens groups 14A and 14B such that areas of both the first and second lens groups 14A and 14B are reduced as compared to the example of FIG. 2A.

Alternatively, the third lens group 14C may be disposed in a space which is created between the first and second lens groups 14A and 14B such that a certain portion of the first lens group 14A positioned adjacent to the second lens group 14B is reduced, and further may be disposed in a space which is created between the first and second lens groups 14A and 14B such that a certain portion of the second lens group 14B positioned adjacent to the first lens group 14A is reduced.

In the example shown in FIG. 2C, the plurality of prisms 18 of the second lens group 14B shown in FIG. 2A are replaced by a convex Fresnel lens which, as described above with reference to FIG. 2B, is composed of the plurality of prisms 20 each having the inclined face 20a facing in the direction opposite to the optical axis C of the light source 12.

Description will now be made, in conjunction with FIG. 3A to 3D and by comparing with comparative examples of lens sheets, of the exiting lights L emitted from the light source 12 which, when coming out from the lens sheet 14, are deflected by the plurality of prisms 16 of the first lens group 14A of the illuminating device 10 using the lens sheet 14 shown in FIG. 2A.

Figure 3A:
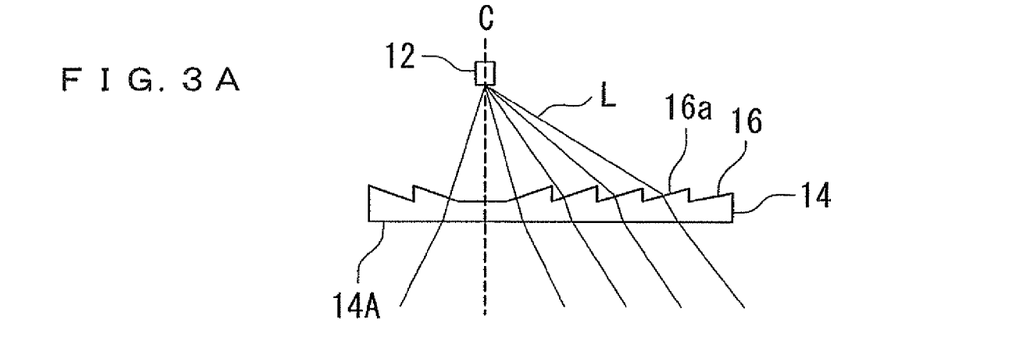
FIG. 3A is an explanatory cross-sectional view of optical paths of exiting lights which are emitted from the light source and come out via the first lens group of the lens sheet of the illuminating device shown in FIG. 1A.

Referring to FIG. 3A, when the lens sheet 14 has the first lens group 14A constituted by the plurality of prisms 16, that is a concave Fresnel lens, the exiting lights L emitted from the light source 12, when exiting from the lens sheet 14, are deflected outwardly with respect to the optical axis C of the light source 12 due to refraction at the inclined face 16*a* facing toward the optical axis C of the light source 12.

Consequently, the above described exiting lights L emitted from the light source 12 and coming out via the first lens group 14A of the lens sheet 14 are adapted to well mix with the exiting lights which come out via the second lens group 14B composed of the plurality reflecting prisms 18 and located so as to surround the first lens group 14A and which travel parallel to the optical axis C of the light source 12 (refer to FIG. 8).

Figure 3B:
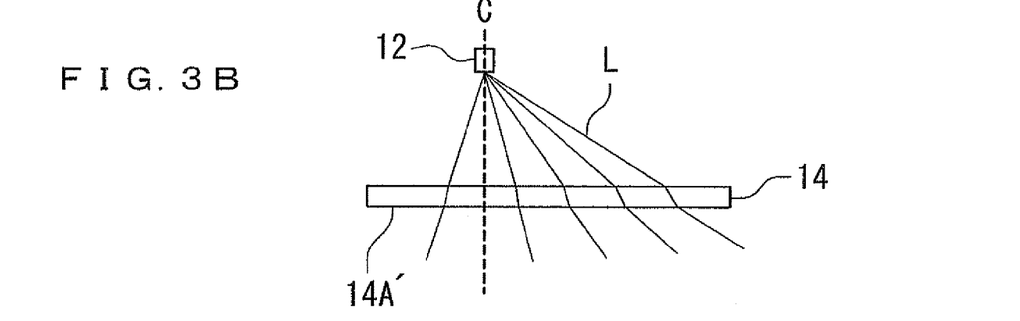
FIG. 3B is an explanatory cross-sectional view of optical paths in a comparative example of first lens group.

Referring now to FIG. 3B, when the lens sheet 14 has a first lens group 14A' which does not include prisms but is formed only with a plane surface, the exiting lights L emitted from the light source 12, when entering the first lens group 14A' of the lens sheet 14 and coming out therefrom, have their optical paths changed in some degree due to refraction, but the angles of the optical paths of the lights entering are substantially equal to the angles of the optical paths of the corresponding lights coming out.

Accordingly, compared to the lens sheet 14 according to the embodiment of the present invention shown in FIG. 3A, the above described exiting lights coming out from the first lens group 14A' are not expected to mix so much with the exiting lights which come out via the second lens group 14B composed of the plurality of reflecting prisms 18 and located so as to surround the first lens group 14A' and which travel parallel to the optical axis C of the light source 12 (refer to FIG. 8).

Figure 3C:
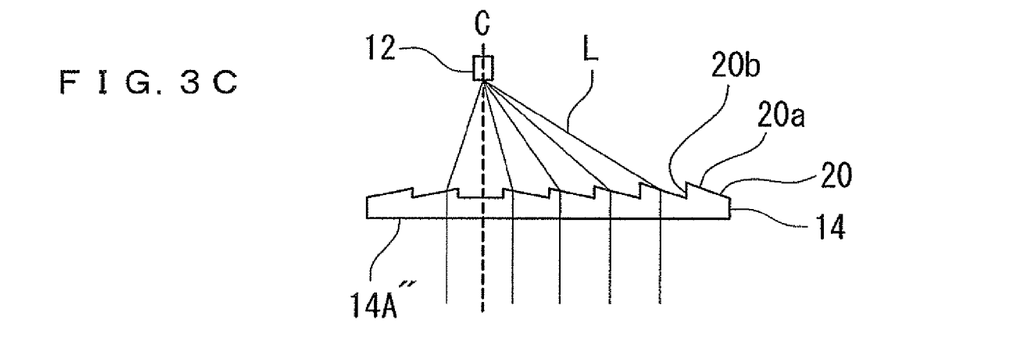
FIG. 3C is an explanatory cross-sectional view of optical paths in another comparative example of first lens group.

Referring also to FIG. 3C, the lens sheet 14 has a first lens group 14A" which is constituted by a convex Fresnel lens and which includes a plurality of prisms 20 formed such that inclination angles of their respective inclined faces 20*a* increase with an increase in the distance from the optical axis C of the light source 12.

In the case described above, depending on the inclination angle, due to refraction at the inclined faces 20*a* of the prisms 20 facing in the direction opposite to the optical axis C of the light source 12, the exiting lights L emitted from the light source 12 are deflected and come out from the lens sheet 14 so as to travel in the direction parallel to the optical axis C of the light source 12.

Even though the inclination angles of the inclined faces 20*a* of the prisms 20 are increased, the exit angles (outward angle with respect to the optical axis C of the light source 12) of the exiting lights L coming out from the first lens group 14A" of the lens sheet 14 cannot be so large as the exit angles of the exiting lights L coming out from the first lens group 14A' of the lens sheet 14 shown in FIG. 3B which does not include prisms but is formed only with a plane surface as described earlier.

This means that it can hardly be expected that the exiting lights L emitted from the light source 12 and coming out from the first lens group 14A" of the lens sheet 14 mix with the exiting lights which come out via the second lens group 14B composed of the plurality of reflecting prisms 18 and located so as to surround the first lens group 14A" and which travel parallel to the optical axis C of the light source 12 (refer to FIG. 8).

Figure 3D:
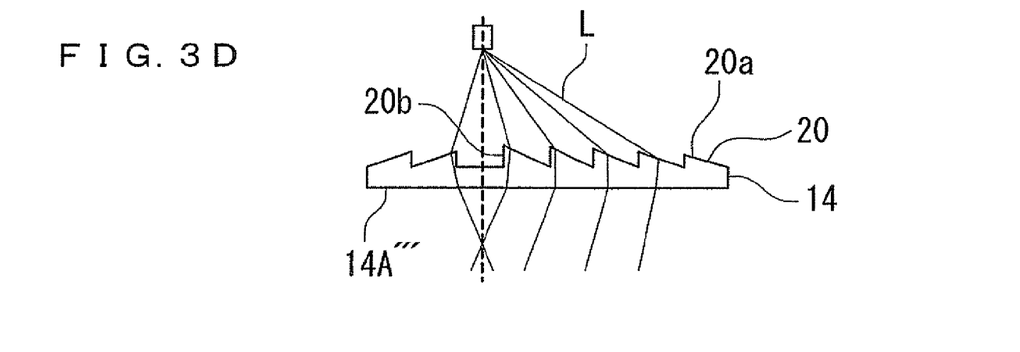
FIG. 3D is an explanatory cross-sectional view of optical paths in still another comparative example of first lens group.

Referring further to FIG. 3D, the lens sheet 14 has a first lens group 14A''' which is constituted by a convex Fresnel lens and in which a plurality of prisms 20 are formed such that inclination angles of their respective inclined faces 20*a* decrease with an increase in the distance from the optical axis C of the light source 12.

In the prism arrangement described above, depending on the inclination angle, due to refraction at the inclined faces 20*a* of the prisms 20 facing in the direction opposite to the optical axis C of the light source 12, the exiting lights L emitted from the light source 12 are deflected and come out from the first lens group 14A''' of the lens sheet 14 so as to travel definitely toward the optical axis C of the light source 12.

If the inclination angle of the inclined face 20*a* is increased, the deflection effect described above can be enhanced. Increasing the inclination angle of the inclined face 20*a*, however, leads to increasing the height of the prisms 20, which results in increasing the ratio of a portion of the exiting lights L emitted from the light source 12 which enters faces 20*b* (hereinafter, referred to as "parallel faces") facing toward the optical axis C of the light source 12 and oriented parallel to the optical axis C of the light source 12.

The lights which enter the parallel faces 20*b* do not travel in the direction frontward of the light emitting face 12*a* (refer to FIG. 1A) of the light source 12 thus becoming what is called "stray light" and fail to serve as effective lights, which results in lowering the utilization efficiency of light.

Accordingly, in the case of the comparative example shown in FIG. 3D, although it can be expected that the exiting lights L emitted from the light source 12 and coming out via the first lens group 14A''' of the lens sheet 14 mix with the exiting lights coming out via the second lens group 14B composed of the plurality of reflecting prisms 18 and located so as to surround the first lens group 14A''' and which travel parallel to the optical axis C of the light source 12 (refer to FIG. 8), the brightness of illumination light of the illuminating device 10 is deteriorated.

Figure 4:
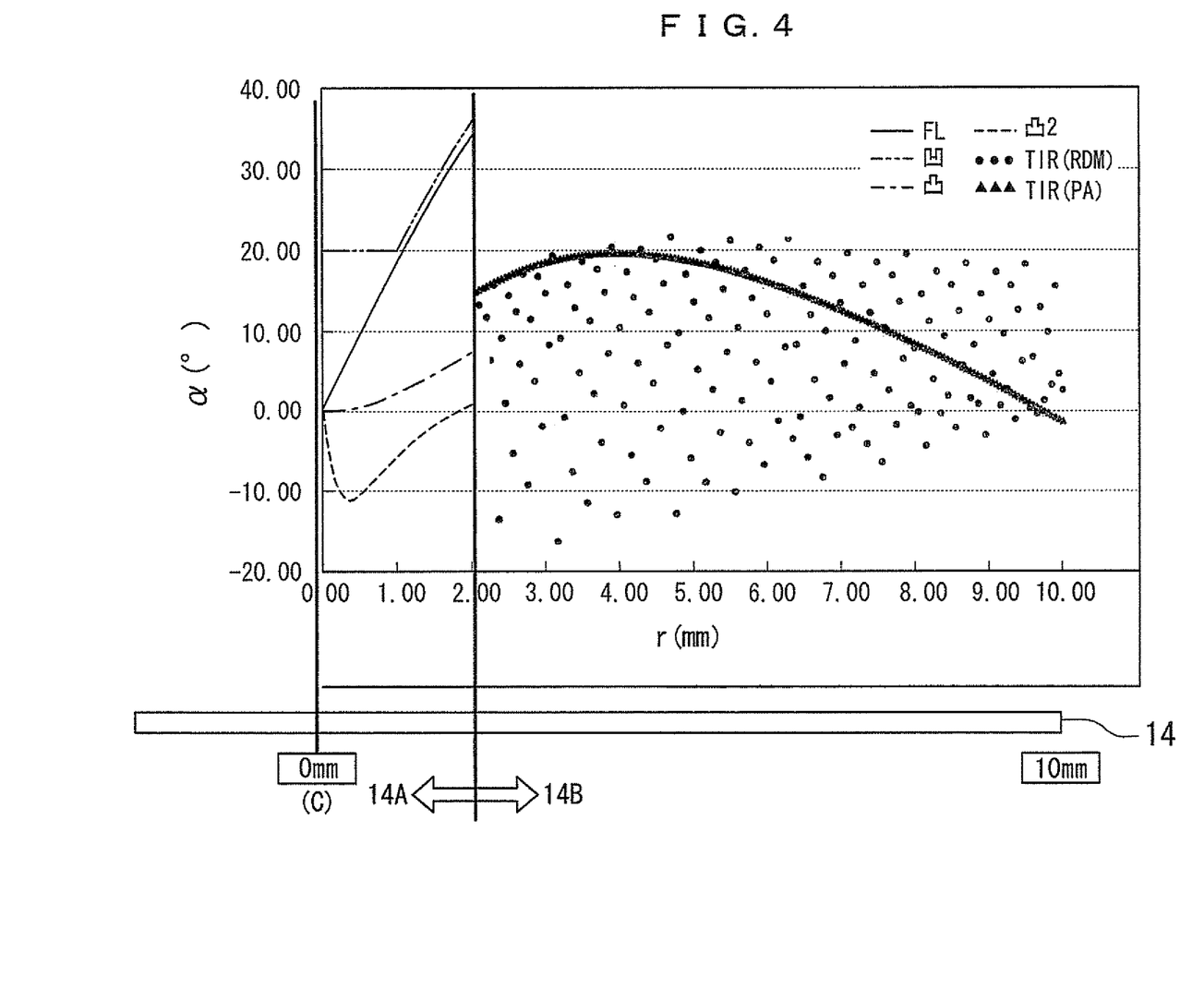
FIG. 4 is a graph of an exit angle of an exiting light coming out from the lens sheet as a function of a distance between the exiting light and the optical axis of the light source in the illuminating device shown in FIG. 1A, wherein a schematic cross-sectional view of the lens sheet is shown together.
Figure 5A:
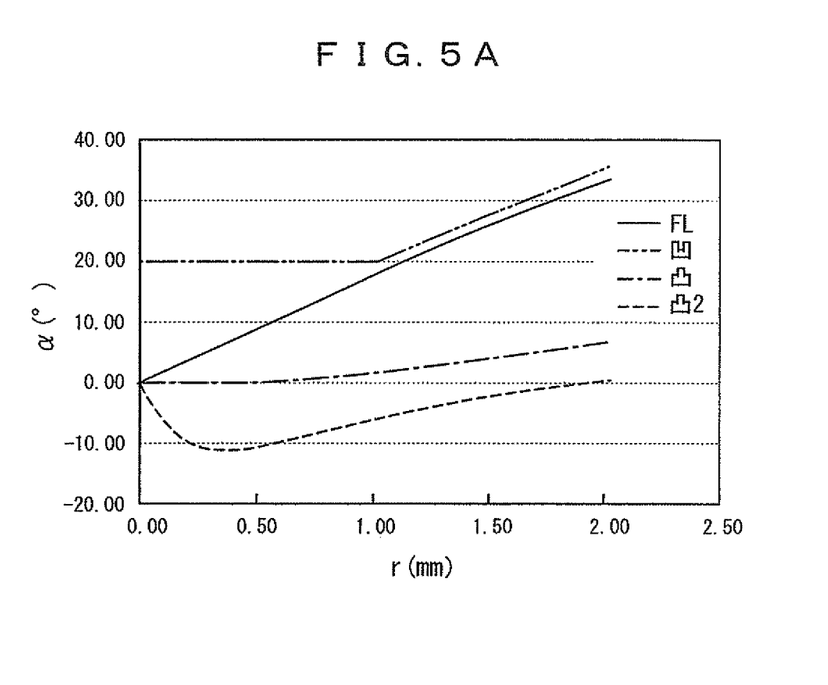
FIG. 5A is a graph of a portion of the graph shown in FIG. 4 where a range of the exiting lights coming out via the first lens group is extracted.
Figure 5B:
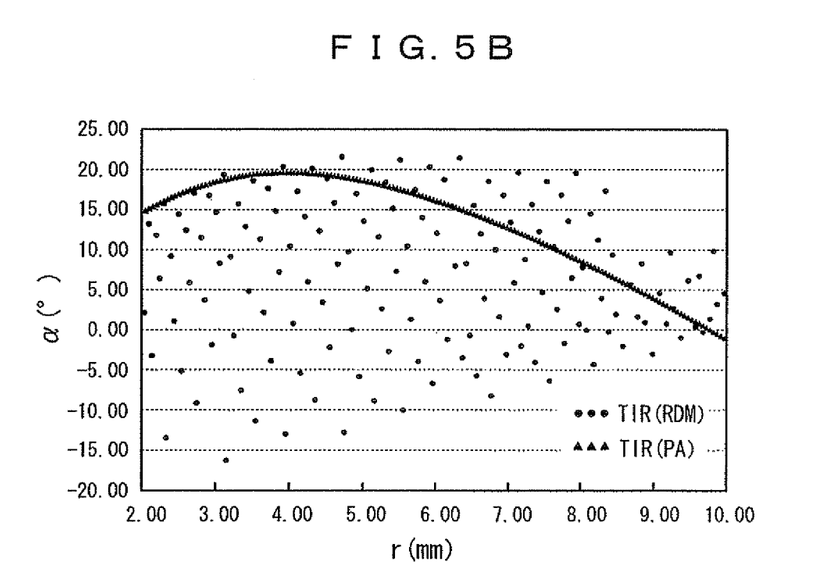
FIG. 5B is a graph of a portion of the graph shown in FIG. 4 where a range of the exiting lights coming out via a second lens group is extracted.

In each of FIG. 4 and FIGS. 5A and 5B, the horizontal axis indicates a distance r (mm) between the first/second lens group 14A/14B and the center (that is, the optical axis C of the light source 12) in the illuminating device 10 using the lens sheet 14 shown in FIGS. 1A, 1B and 2A, and the vertical axis indicates an exit angle α (degrees) of the exiting lights coming out from the lens sheet 14.

In FIG. 4 and FIGS. 5A and 5B, data concerning the first lens group 14A (shown in FIG. 3A) according to the embodiment of the present invention are indicated by reference symbol ⊡. On the other hand, data concerning the first lens groups 14A', 14A" and 14A''' (comparative examples shown in FIGS. 3B, 3C and 3D) are indicated by reference symbols FL, ⊞ and ⊞ 2, respectively. Also, data concerning the second lens group 14B composed of the reflecting prisms 18 with inclined faces having respective inclination angles set at random are indicated by reference symbol TIR (RDM), and data concerning the second lens group 14B composed of the reflecting prisms 18 with inclined faces having respective inclination angles set at a regular value are indicated by reference symbol TIR (PA).

In the region ranging from the optical axis C of the light source 12 up to the distance r of 1 mm, the first lens group 14A of the lens sheet 14 according to the embodiment of the present invention is structured such that in consideration of the distance Y between the light emitting face 12*a* of the light source 12 and the side surface 14*a* (facing the light source 12) of the lens sheet 14, the inclination angles θ1, θ2, θ3 and so on of the inclined faces 16*a* of the prisms 161, 162, 163 and so on decrease with an increase in the distance from the optical axis C of the light source 12 as shown in FIGS. 1A and 1B, in order that all of the lights emitted from the light source 12 and then coming out via the first lens group 14A exit from the lens sheet 14 at a uniform angle α of 20 degrees independently of the distance from the optical axis C of the light source 12.

It is shown in FIGS. 4 and 5A that the exit angles α of the exiting lights emitted from the first lens groups 14A are kept uniform at 20 degrees in the region ranging from the optical axis C of the light source 12 up to the distance r of 1 mm. On the other hand, in the region ranging from the distance r of 1 mm to the distance r of 2 mm, the inclination angles of the inclined faces 16a of the prisms 16 are so determined that the exit angles α of the exiting lights increase continuously.

Also, it is shown in FIGS. 4 and 5A that in the entire region ranging up to the distance r of 2 mm, the exit angles α (indicated by reference symbol ⌂) concerning the first lens group 14A according to the embodiment of the present invention are larger than the exit angles α (indicated by reference symbols FL, ⌂ and ⌂2) concerning the above described comparative examples of first lens groups.

Further, it is shown in FIGS. 4 and 5B that in the entire region ranging from the distance r of 2 mm and farther where the second lens group 14B is located, the exit angles α (indicated by reference symbol ⌂) of the exiting lights vary at random independently of the distance from the optical axis C of the light source 12. Consequently, the exiting lights emitted from the light source 12 and coming out via the first lens group 14A are further adapted to mix well with the exiting lights emitted from the light source 12 and coming out via the second lens group 14B.

Figure 6:
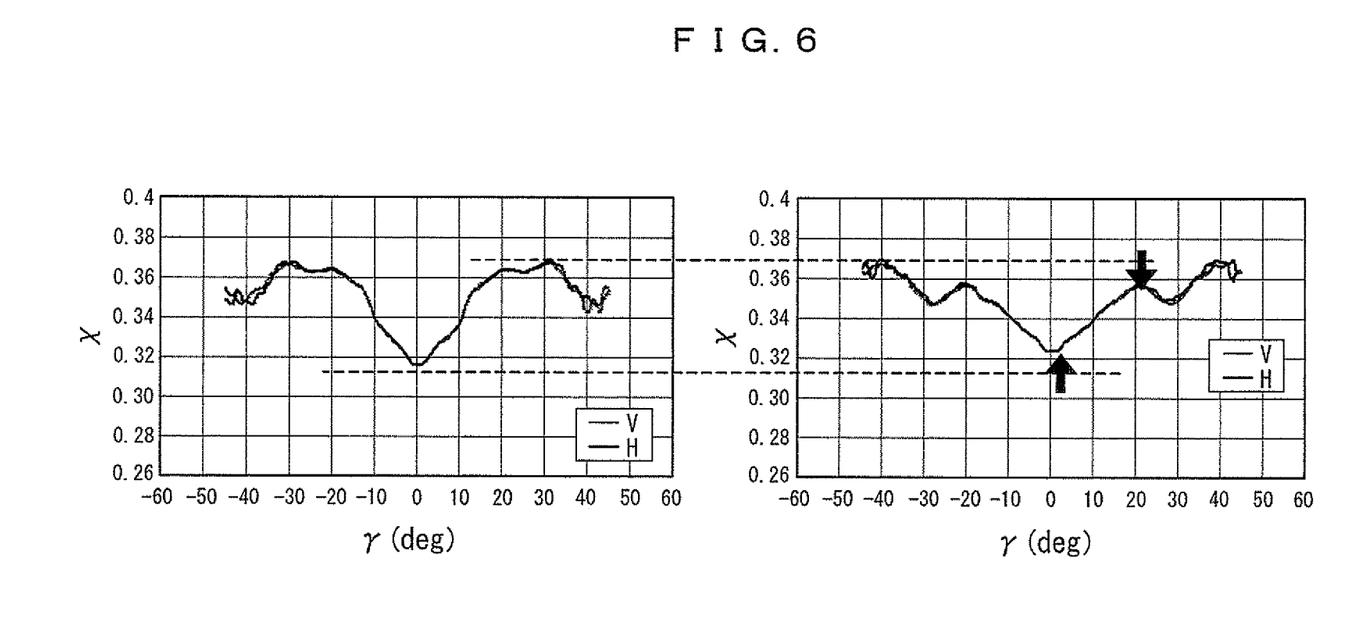
FIG. 6 is a graph of comparison between a chromaticity distribution of the illuminating device shown in FIG. 1A and a chromaticity distribution of an illuminating device according to a reference example.

FIG. 6 shows a comparison graph in which the illuminating device 10 using the lens sheet 14 according to the embodiment of the present invention shown in FIG. 2A (refer to right side) is compared with the illuminating device using the lens sheet 14 according to the comparative example as shown in FIG. 3C (refer to left side), wherein a relation between a directivity angle r (degrees) and a chromaticity X is shown.

In FIG. 6, reference symbol V indicates one direction (vertical) on the surface plane of a square light emitting face of the pseudo white LED 100 (refer to FIG. 7), and reference symbol H indicates another direction (orthogonal to the aforementioned vertical direction, thus oriented horizontal) on the surface plane of the square light emitting face.

It is shown from FIG. 6 that in the illuminating device 10 according to the embodiment of the present invention the chromaticity is enhanced at the center (the optical axis C of the light source 12) and at the same time is lowered around the directivity angle of ±20 (degrees) when compared to in the illuminating device using the comparative example lens sheet, whereby the variation ΔX of the chromaticity X between the center and the peak is reduced from 0.53 to 0.34.

Accordingly, it is proved that the degree of the color unevenness, which inevitably occurs in illuminating devices using the pseudo white LED 100 (refer to FIG. 7) as a light source, can be reduced in the illuminating device 10 according to the example (FIG. 2A) of the embodiment of the present invention.

In this connection, though the concrete data are not presented, in the illuminating devices including the lens sheets 14 according to the modified examples of FIGS. 2B and 2C, since the plurality of prisms 16 each having the inclined face 16a facing toward the optical axis C of the light source 12 are included in the first lens groups 14A in the same way as in the first lens group 14A according to the example of FIG. 2A, the same effect of reducing the color unevenness can be achieved as in the illuminating device 10.

In the illuminating device according to the embodiment of the present invention, the following effects and advantages can be achieved.

Specifically, when the exiting lights L originated from the light source 12 exit from the lens sheet 14 including the plurality of prisms 16 arranged symmetrically with respect to the optical axis C of the light source 12, the optical paths of the exiting lights L are deflected in the direction opposite to the optical axis C of the light source 12 by means of the plurality of prisms 16 which are included in the first lens group 14A arranged on the inward side of the lens sheet 14 so as to be located adjacent to the optical axis C of the light source 12 and each of which has the inclined face 16a facing toward the optical axis C of the light source 12.

Here, if the heights of the prisms 16 are increased, when controlling the direction of the deflection, in order to change the inclination angle θn of the inclined face 16a in accordance with the distance from the optical axis C of the light source 12, the area of the parallel face 16b (refer to FIG. 1B) of the prism 16 oriented parallel to the optical axis C of the light source 12 is increased.

However, since the inclined faces 16a of the prisms 16 of the first lens group 14A face toward the optical axis C of the light source 12, the exiting lights L emitted from the light source 12 do not enter directly the parallel face 16b of the prism 16, and thus the utilization efficiency of light is not lowered.

And, the exiting lights L emitted from the light source 12 and coming out via the first lens group 14A of the lens sheet 14 are adapted to mix well with the exiting lights emitted from the light source 12 and coming via the second lens group 14B located outside the first lens group 14A, and therefore in the illuminating device 10, the degree of the color unevenness is reduced, that appears inherently when the pseudo white LED 100 (refer to FIG. 7) is used as the light source 12 of the illuminating device 10.

Also, since the plurality of prisms 161, 162, 163 and so on of the first lens group 14A are formed such that respective inclination angles θ1, θ2, θ3 and so on of the inclined faces 16a decrease with an increase in the distance from the optical axis C of the light source 12 (thus, θ1>θ2>θ3), the direction of the exiting lights L can be controlled by the plurality of prisms 16 of the first lens group 14 in accordance with the distance from the optical axis C of the light source 12.

And, as shown in FIG. 1B, the inclination angles of the inclined faces of the prisms are decreased with an increase in the distance from the optical axis C of the light source 12, so that all of the lights L emitted from the light source 12 and then coming out via the first lens group 14A are adapted to exit from the lens sheet 14 at a uniform angle independent of the distance from the optical axis C of the light source 12, whereby the exiting lights emitted from the light source 12 and coming out via the first lens group 14A can be mixed in a controlled manner with the exiting lights emitted from the light source 12 and coming out via the second lens group 14B located outside the first lens group 14A.

Also, the second lens group 14B includes the plurality of reflecting prisms 18, and thereby in a region of the lens sheet 14 located away from the optical axis C of the light source 12 so as to surround the first lens group 14A, the exiting lights L emitted from the light source 12 and coming out via the second lens group 14B are deflected so as to travel in the direction parallel to or approaching the optical axis C of the light source 12.

Accordingly, the exiting lights emitted from the light source 12 and coming out via the first lens group 14A can be well mixed with the exiting lights emitted from the light source 12 and coming out via the second lens group 14B located outside the first lens group 14A.

Also, if the third lens group 14C is disposed between the first lens group 14A and the second lens group 14B as shown in FIG. 2B, the exiting lights L emitted from the light source 12 are deflected also by the third lens group 14C.

Since the third lens group 14C includes the prisms 20 each having the inclined face 20a facing in the direction opposite to the optical axis C of the light source 12, the exiting lights L emitted from the light source 12 and entering the third lens group 14C are refracted at the inclined faces 20a of the prisms 20 and thereby deflected so as to travel in the direction toward (which is the opposite direction compared to the deflection of the exiting lights coming out via the first lens group 14A) or parallel to the optical axis C of the light source 12.

The exiting lights emitted from the light source 12 and coming out via the first lens group 14A, the exiting lights emitted from the light source 12 and coming out via the second lens group 14B, and the exiting lights emitted from the light source 12 and coming out via the third lens group 14C arranged between the first and second lens groups 14A and 14B are adapted to mix with one another thereby achieving further color mix.

Further, if the second lens group 14B is provided with the plurality of prisms 20 each having the inclined face 20a facing in the direction opposite to the optical axis C of the light source 12 as shown in FIG. 2C, the exiting lights emitted from the light source 12 and coming out via the first lens group 14A can be well mixed with the exiting lights emitted from the light source 12 and coming out via the second lens group 14B as described above, and the same effects and advantages can be achieved.

According to the embodiment of the present invention, the plurality of the respective prisms 16, 18 and 20 of the first, second and third lens groups 14A, 14B and 14C of the lens sheet 14 are arranged rotationally symmetrically with respect to the optical axis C of the light source 12, whereby the exiting lights L emitted from the light source 12 and coming out via lens sheet 14 can be well mixed with one another with respect to all the radial directions around the optical axis C of the light source 12.

In this connection, if the first, second and third lens groups 14A, 14B and 14C of the lens sheet 14 are linearly arranged prisms (linear prisms), the same effects and advantages can be achieved with a certain degree of directivity.

And, the light source 12 includes the blue LED 102 as a light emitting element and the yellow color fluorescent material 108 to receive light from the light emitting element (blue LED 102) and to emit fluorescence, whereby a blue light emitted from the blue LED 102 is subjected to wavelength conversion by the yellow color fluorescent material 108 into a yellow light fluorescence, thus constituting the pseudo white LED 100.

And, the exiting lights emitted from the pseudo white LED 100 are well mixed with one another by means of the prisms 16, 18 and 20 of the first, second and third lens groups 14A, 14B and 14C of the lens sheet 14 as described above, and the color unevenness inherent to the pseudo white LED 100 can be reduced or even overcome.

What is claimed is:

1. An illuminating device comprising:
 a light source which comprises a light emitting element and a fluorescent material; and
 a lens sheet which comprises a plurality of prisms arranged symmetrically with respect to an optical axis of the light source, and which at least comprises a first lens group located adjacent to the optical axis of the light source and a second lens group located outside the first lens group, wherein the first lens group comprises a plurality of refracting prisms each having an inclined face facing toward the optical axis of the light source and an imaginary plane that is perpendicular to the optical axis of the light source, the inclined face and the imaginary plane defining an inclination angle there-between, wherein the plurality of prisms comprised in the first lens group are configured such that respective inclination angles of the inclined faces decrease with an increase in distance from the optical axis of the light source,
 wherein the second lens group comprises a plurality of reflecting prisms.

2. An illuminating device according to claim 1, further comprising a third lens group which is located between the first lens group and the second lens group and which comprises a plurality of prisms each having an inclined face facing in a direction opposite to the optical axis of the light source.

3. An illuminating device according to claim 1, wherein the second lens group comprises a plurality of prisms each having an inclined face facing in a direction opposite to the optical axis of the light source.

4. An illuminating device according to claim 1, wherein the plurality of the prisms comprised in each of the first and second lens groups are arranged rotationally symmetrically with respect to the optical axis of the light source.

5. An illuminating device according to claim 1, wherein the light emitting element is a blue light emitting diode, and the fluorescent material causes a blue light emitted from the blue light emitting diode to be subjected to wavelength conversion into a yellow color fluorescence.

6. An illuminating device according to claim 1,
 wherein each inclination angle of the plurality of reflecting prisms is set at random.

7. An illuminating device comprising:
 a light source which comprises a light emitting element and a fluorescent material; and
 a lens sheet which comprises a plurality of prisms arranged symmetrically with respect to an optical axis of the light source, and which at least comprises a first lens group located adjacent to the optical axis of the light source, a second lens group located outside the first lens group, and a third lens group which is located between the first lens group and the second lens group,
 wherein the first lens group comprises a plurality of prisms each having an inclined face facing toward the optical axis of the light source, the second lens group comprises a plurality of reflecting prisms, and the third lens group comprises a plurality of prisms each having an inclined face facing in a direction opposite to the optical axis of the light source.

* * * * *